United States Patent
Balchiunas (10) Patent No.: US 7,463,047 B2
(45) Date of Patent: Dec. 9, 2008

(54) INCREASE PRODUCTIVITY AT WAFER TEST USING PROBE RETEST DATA ANALYSIS

(75) Inventor: Akiko F. Balchiunas, Hinesburg, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/736,600

(22) Filed: Apr. 18, 2007

(65) Prior Publication Data

US 2007/0288190 A1    Dec. 13, 2007

Related U.S. Application Data

(63) Continuation of application No. 10/709,729, filed on May 25, 2004, now Pat. No. 7,253,650.

(51) Int. Cl.
*G01R 31/26*    (2006.01)

(52) U.S. Cl. .............. 324/763; 324/765; 324/73.1

(58) Field of Classification Search .............. None
See application file for complete search history.

(56) References Cited

U.S. PATENT DOCUMENTS

| | | |
|---|---|---|
| 5,764,650 A | 6/1998 | Debenham |
| 5,867,505 A | 2/1999 | Beffa |
| 6,043,101 A | 3/2000 | Stubblefield et al. |
| 6,240,329 B1 | 5/2001 | Sun |
| 6,350,959 B1 | 2/2002 | Beffa |
| 6,499,118 B1 * | 12/2002 | Michaelson .............. 714/711 |
| 6,507,800 B1 | 1/2003 | Sheu |
| 6,618,682 B2 | 9/2003 | Bulaga et al. |
| 6,728,652 B1 | 4/2004 | Kobayashi |
| 7,017,429 B2 | 3/2006 | Schuntermann et al. |
| 7,027,946 B2 | 4/2006 | Williams et al. |
| 2003/0120045 A1 | 6/2003 | Barbour et al. |
| 2003/0139839 A1 | 7/2003 | Beffa |

FOREIGN PATENT DOCUMENTS

JP    05-074878    3/1993

* cited by examiner

*Primary Examiner*—Minh N Tang
(74) *Attorney, Agent, or Firm*—Gibb & Rahman, LLC; Richard M. Kotulak, Esq.

(57) ABSTRACT

Disclosed is a method of wafer/probe testing of integrated circuit devices after manufacture. The invention begins by testing an initial group of devices (e.g., integrated circuit chips) to produce an initial failing group of devices that failed the testing. The devices in the initial failing group are identified by type of failure. Then, the invention retests the devices in the initial failing group to identify a retested passing group of devices that passed the retesting. Next, the invention analyzes the devices in the retested passing group which allows the invention to produce statistics regarding the likelihood that a failing device that failed the initial testing will pass the retesting according to the type of failure. Then, the invention evaluates these statistics to determine which types of failures have retest passing rates above a predetermined threshold. From this, the invention produces a database comprising an optimized retest table listing the types of defects that are approved for retesting.

10 Claims, 9 Drawing Sheets

1st Pass Test Sorts

| Lot ID | WaferID | CHIP X | CHIP Y | Suffix | sort | Description |
|--------|---------|--------|--------|--------|------|-------------|
| Lot001 | WaferA | 1 | 1 | RWJ1 | 2 | Contact Opens |
| Lot001 | WaferA | 1 | 2 | RWJ1 | 1 | GOOD |
| Lot001 | WaferA | 1 | 3 | RWJ1 | 3 | Contact Shorts |
| Lot001 | WaferA | 1 | 4 | RWJ1 | 6 | Leakage |
| Lot001 | WaferA | 1 | 5 | RWJ1 | 20 | Func 2 |

FIG. 3

2dn Pass Test Sorts

| Lot ID | WaferID | CHIP X | CHIP Y | Suffix | sort | Description |
|--------|---------|--------|--------|--------|------|-------------|
| Lot001 | WaferA | 1 | 1 | RWJ2 | 11 | PLL Fail |
| Lot001 | WaferA | 1 | 3 | RWJ2 | 1 | GOOD |
| Lot001 | WaferA | 1 | 4 | RWJ2 | 6 | Leakage |
| Lot001 | WaferA | 1 | 5 | RWJ2 | 8 | Cat2_Good |

FIG. 4

Combined 1st & 2nd Pass Test Sorts

| Lot ID | WaferID | CHIP X | CHIP Y | 1st PASS SORT | 2nd PASS SORT | Description |
|--------|---------|--------|--------|---------------|---------------|-------------|
| Lot001 | WaferA  | 1      | 1      | 2             | 11            | BAD         |
| Lot001 | WaferA  | 1      | 2      | 1             | *             | 1st PASS GOOD |
| Lot001 | WaferA  | 1      | 3      | 3             | 1             | GOOD        |
| Lot001 | WaferA  | 1      | 4      | 6             | 6             | BAD         |
| Lot001 | WaferA  | 1      | 5      | 20            | 8             | Cat2_GOOD   |

FIG. 5

Results of Freq. Analysis:

| Sort | Description | BAD | Cat 2 Good | Good | TOTAL |
|---|---|---|---|---|---|
| 2 | Contact Opens | 3 | 43 | 25 | 71 |
| 3 | Contact Shorts | 2 | 9 | 5 | 16 |
| 6 | Leakage | 2 | | | 2 |
| 10 | ECID | 24 | 2 | 2 | 28 |
| 11 | PLL | 6 | 1 | 2 | 9 |
| 14 | Probe Melt | 1 | 5 | 2 | 8 |
| 19 | Func 1 | 31 | 1 | 1 | 33 |
| 20 | Func 2 | 31 | | 1 | 32 |
| 21 | Func 3 | 10 | 1 | | 11 |
| 22 | Func 4 | 5 | | | 5 |
| 24 | Contact IO Opens | 1 | 4 | 10 | 15 |
| 26 | Func 5 | 4 | 1 | | 5 |
| 27 | Func 6 | 32 | 3 | 1 | 36 |
| 28 | Func 7 | 1 | | | 1 |
| 29 | Func 8 | 0 | | 1 | 1 |
| 34 | Func 9 | 7 | | | 7 |
| 38 | Func 10 | 1 | | | 1 |
| 40 | ABIST 1 | 59 | 2 | | 61 |
| 41 | ABIST 2 | 14 | 1 | 1 | 16 |

FIG. 6

TGYL Fail Sorts:

| Sort | Description | TGYL Fail? |
|---|---|---|
| 2 | Contact Opens | Y |
| 3 | Contact Shorts | Y |
| 6 | Leakage | Y |
| 14 | Probe Melt | Y |
| 24 | Contact IO Opens | Y |

FIG. 7

Non-TGYL Fail Sorts:

| Sort | Description | TGYL Fail? |
|---|---|---|
| 10 | ECID | N |
| 11 | PLL | N |
| 19 | Func 1 | N |
| 20 | Func 2 | N |
| 21 | Func 3 | N |
| 22 | Func 4 | N |
| 26 | Func 5 | N |
| 27 | Func 6 | N |
| 28 | Func 7 | N |
| 29 | Func 8 | N |
| 34 | Func 9 | N |
| 38 | Func 10 | N |
| 40 | ABIST 1 | N |
| 41 | ABIST 2 | N |

FIG. 8

SORT RECOVERY DATASET:

| Sort | Description | TGYL Fail? | BAD | Cat 2 Good | Good |
|---|---|---|---|---|---|
| 2 | Contact Opens | Y | 3 | 43 | 25 |
| 3 | Contact Shorts | Y | 2 | 9 | 5 |
| 6 | Leakage | Y | 2 | | |
| 10 | ECID | | 24 | 2 | 2 |
| 11 | PLL | | 6 | 1 | 2 |
| 14 | Probe Melt | Y | 1 | 5 | 2 |
| 19 | Func 1 | | 31 | 1 | 1 |
| 20 | Func 2 | | 41 | | 1 |
| 21 | Func 3 | | 10 | 1 | |
| 22 | Func 4 | | 5 | | |
| 24 | Contact IO Opens | Y | 1 | 4 | 10 |
| 26 | Func 5 | | 4 | 1 | |
| 27 | Func 6 | | 32 | 3 | 1 |
| 28 | Func 7 | | 1 | | |
| 29 | Func 8 | | 0 | | 1 |
| 34 | Func 9 | | 7 | | |
| 38 | Func 10 | | 1 | | |
| 40 | ABIST 1 | | 59 | 2 | |
| 41 | ABIST 2 | | 14 | 1 | 1 |

FIG. 9

CUSTOMER DEMAND SORT TABLE:

| Sort | Description | Customer Demand |
|---|---|---|
| 1 | GOOD | Y |
| 8 | CAT2_GOOD | NO_DEMAND |

FIG. 10

OPTIMIZED RETEST SORT TABLE:

Retest all TGUL fails and only Good sorts. In this case, no demand for Cat2_Good.

| Sort | Description | TGYL Fail? | BAD | Cat 2 Good | Good | Retest Sort? | TOTAL |
|---|---|---|---|---|---|---|---|
| 2 | Contact Opens | Y | 3 | 43 | 25 | Y | 71 |
| 3 | Contact Shorts | Y | 2 | 9 | 5 | Y | 16 |
| 6 | Leakage | Y | 2 | | | Y | 2 |
| 10 | ECID | | 24 | 2 | 2 | Y | 28 |
| 11 | PLL | | 6 | 1 | 2 | Y | 9 |
| 14 | Probe Melt | Y | 1 | 5 | 2 | Y | 8 |
| 19 | Func 1 | | 31 | 1 | 1 | Y | 33 |
| 20 | Func 2 | | 31 | | 1 | Y | 32 |
| 21 | Func 3 | | 10 | 1 | | | 11 |
| 22 | Func 4 | | 5 | | | | 5 |
| 24 | Contact IO Opens | Y | 1 | 4 | 10 | Y | 15 |
| 26 | Func 5 | | 4 | 1 | | | 5 |
| 27 | Func 6 | | 32 | 3 | 1 | Y | 36 |
| 28 | Func 7 | | 1 | | | | 1 |
| 29 | Func 8 | | 0 | | 1 | Y | 1 |
| 34 | Func 9 | | 7 | | | | 7 |
| 38 | Func 10 | | 1 | | | | 1 |
| 40 | ABIST 1 | | 59 | 2 | | | 61 |
| 41 | ABIST 2 | | 14 | 1 | 1 | Y | 16 |

INCREASE PRODUCTIVITY AT WAFER TEST USING PROBE RETEST DATA ANALYSIS

CROSS-REFERENCE TO RELATED APPLICATIONS

This application is a continuation of Ser. No. 10/709,729 filed May 25, 2004 U.S. Pat. No. 7,253,650, dated Aug. 7, 2007, which is fully incorporated herein by reference.

BACKGROUND OF INVENTION

1. Field of the Invention

The invention presents a method and system for wafer/probe testing integrated circuit devices after manufacture which optimizes the retest process.

2. Description of the Related Art

Every test facility deals with the problem of not having enough tools to handle the capacity on high volume products. The options to alleviate this issue are either to purchase more testers or to reduce test cycle time (increase productivity). Since a new tester costs millions and lead times are long, using probe data analysis to increase productivity is the most cost effective solution.

SUMMARY OF INVENTION

The invention presents a method and system for wafer/probe testing integrated circuit devices after manufacture. The invention begins by testing an initial group of devices (e.g., integrated circuit chips) to produce an initial failing group of devices that failed the testing. The devices in the initial failing group are identified by type of failure. Then, the invention retests the devices in the initial failing group to identify a retested passing group of devices that passed the retesting. Next, the invention analyzes the devices in the retested passing group which allows the invention to produce statistics regarding the likelihood that a failing device that failed the initial testing will pass the retesting according to the type of failure. Then, the invention evaluates these statistics to determine which types of failures have retest passing rates above a predetermined threshold. From this the invention produces a database comprising an optimized retest table listing the types of defects that are approved for retesting.

The invention can also identify types of devices having a predetermined reduced demand. For example, certain types of devices may no longer be in strong demand, and it may not be worth the cost to retest these types of devices. Therefore, in one option, the invention can add a listing of item types having reduced demand to the database to prevent such reduced demand items from being retested.

Further, some types of defects may be known to be related to improper testing. One contributor to test failures is bad or marginal probe contact due to reasons that include poor test setup and marginal/defective probe hardware. In order to eliminate improper testing errors, the invention can add types of defects associated with testing errors to the types of defects approved for retesting.

Using the information in the optimized retest table database, the invention then tests additional groups of devices to produce additional failing groups of devices. The invention only retests devices that have one of the types of defects approved for retesting, and does not retest the types of devices for which there is reduced demand. This process optimizes the retesting of the devices by only retesting for defects that are above a predetermined retest passing rate.

Thus, with the invention, the data collected at wafer test is analyzed to optimize limits and rules on retest without sacrificing yield. It is important to retest failed devices to avoid discarding properly functioning devices. By not retesting all failed devices and optimizing which devices are tested, substantial testing costs are saved.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Every microelectronics wafer test facility deals with the problem of not having enough tools to handle the capacity on high volume products. The options to alleviate this issue are to purchase more testers, which can be very expensive, and have long lead times. The invention is a new process that optimizes retest by minimizing the number of chips retested, and maximizing the number of customer shippable parts. The invention increases productivity and reduces test cycle time, and also optimizes retest rates.

The invention performs the retest process to maximize the number of good chips at wafer test. A second pass test is required to recover any additional deliverable chips. The traditional methods retest all devices that fail the first pass test. One type of defect, Test Generated Yield Loss (TGYL), includes failures that may have been induced by test operation (i.e., for example, contact fail sort; operator setup problem, or bad probes).

Figure 1:
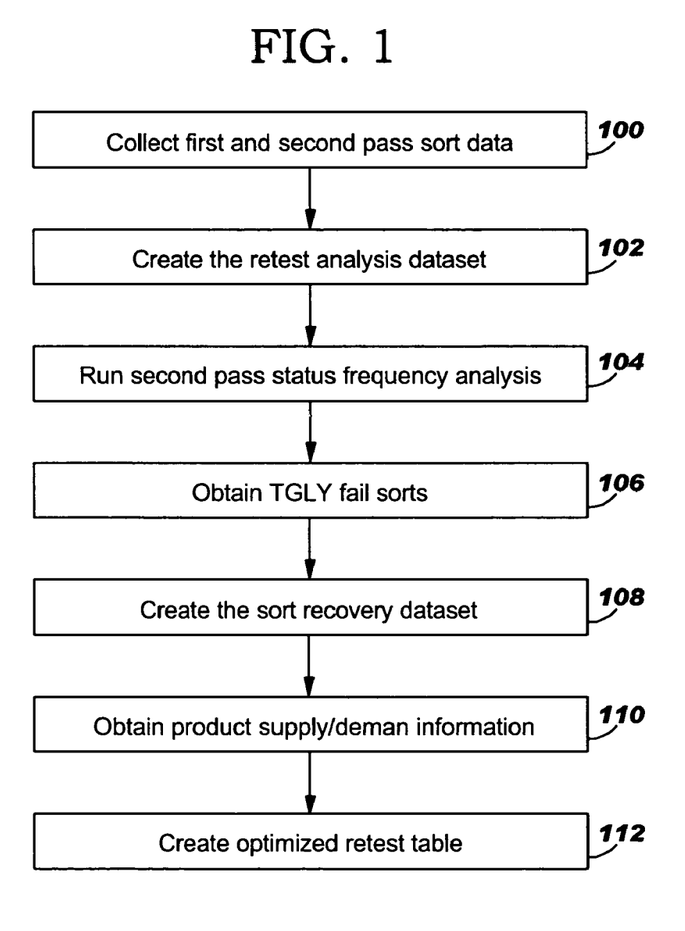
FIG. 1 is a flow diagram illustrating a preferred method of the invention.
Figure 2:
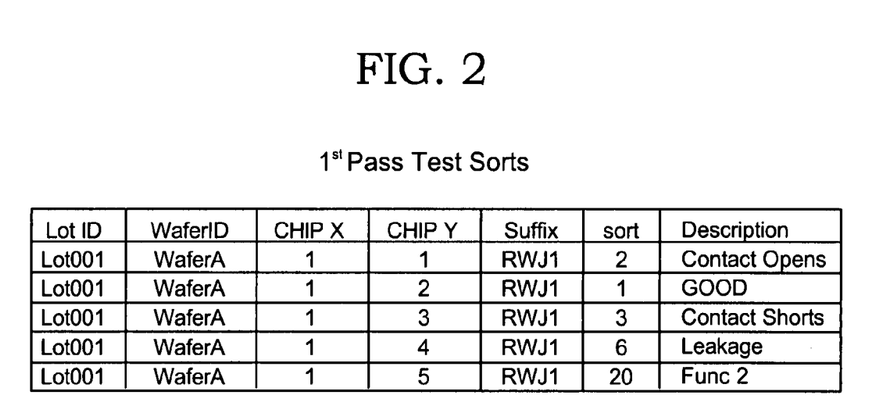
FIG. 2 is a table showing aspects of the invention.

The overall flow of the invention is shown in FIG. 1. In item 100, the invention performs the initial testing, and retests all devices that failed the first pass testing results. The testing (first pass) and retesting (second pass) results are shown in spreadsheet form in FIG. 2. These tables (spreadsheets) identify the lot and wafer that was tested (first two columns), the X and Y coordinates of the area of the wafer tested (next two columns) and the tested area's name (suffix column). The column entitled "sort" refers to the type, or sort, of defect. Different types of defects identified during the testing process are given different numbers. The last column is a shorthand description of the defect type. Note that a "1" defect means that the area or device did not fail the test and is "good."

Figure 3:
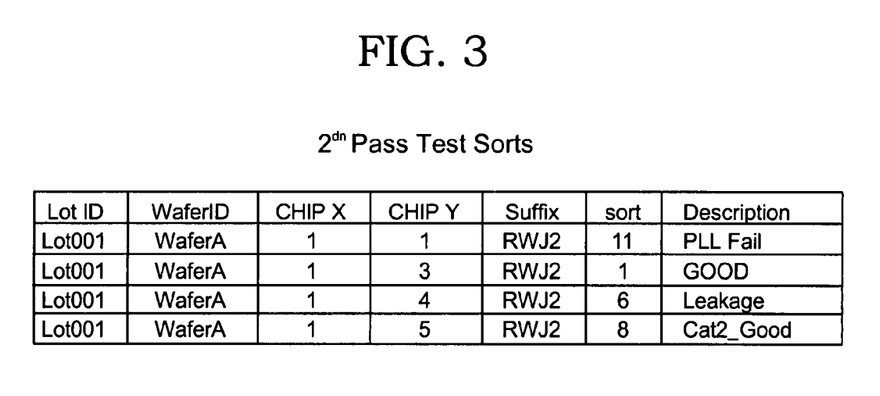
FIG. 3 is a table showing aspects of the invention.
Figure 4:
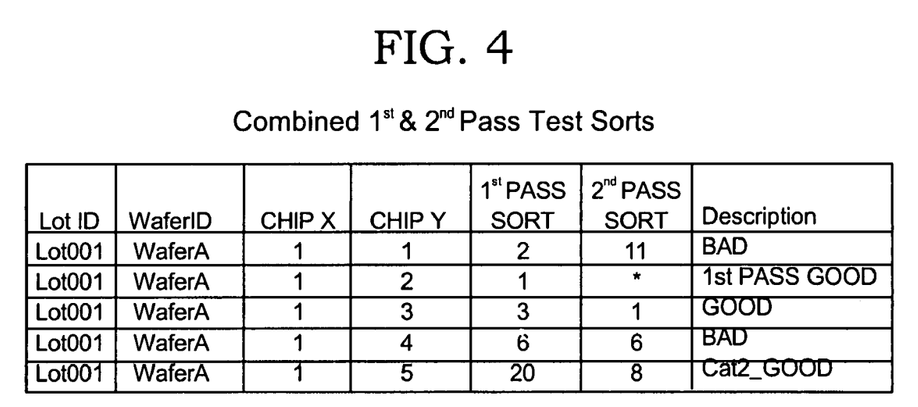
FIG. 4 is a table showing aspects of the invention.

In item 102 in FIG. 1, the invention creates the retest analysis dataset which is shown in FIG. 3, and which combines the data from the first (FIG. 2) and second pass (FIG. 3) testing results into a single table. Note that separate columns are used to identify the different types of defects seen in the first and second passes. Items that passed the first testing are not retested as indicated by an asterisk in the second pass column.

Figure 5:
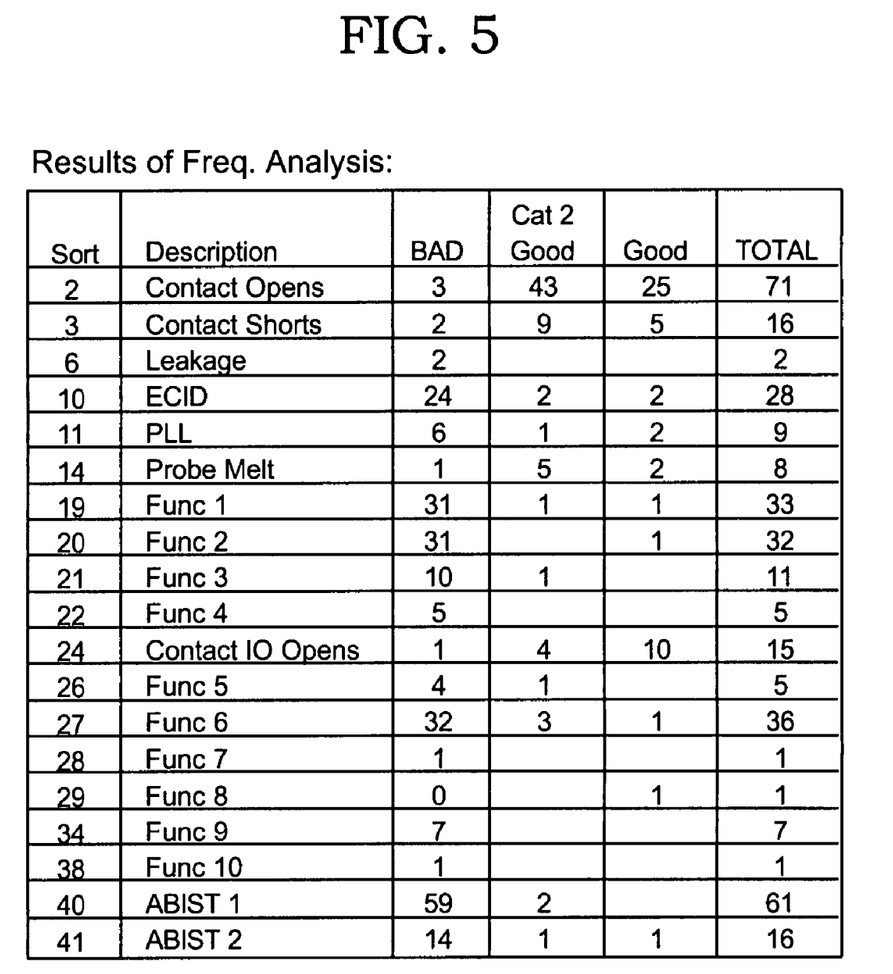
FIG. 5 is a table showing aspects of the invention.

In item 104, the invention runs a second pass status frequency analysis, which is shown in FIG. 5. In FIG. 5, the invention lists each type of defect by number (sort) and description and shows how many of these defects were found. The "bad" column counts the number of failures that were repeated during the retest, which presumably indicates a true defect. The number in the "Cat 2 Good" column represents the number of devices that had some defects, but were good enough to operate, although possibly with limited functionality or reduced speed/performance. For example, many of the devices produced (chips or sections of chips) have redundant portions, or the devices need to have all areas formed correctly to operate at the highest speed (or provide the highest performance). However, some portions of the devices may have defects while the remainder of the device is defect free. Some customers will find these poorer performing or partially defective devices acceptable and may receive such devices at a reduced cost. Therefore, while the "category 2 good" devices underperform the completely defect free "good" devices, the category 2 good devices still have some demand (although a reduced demand). The "Good" column shows the number of devices that recovered (i.e., became good) in the 2nd pass test. The "total" column is the total number of defects of that type that occurred during the first test. Therefore, as shown in FIG. 5, for certain types of defects (e.g., sort 2, 3, etc.) a substantial number of devices retested as being good or category 2 good, which makes retesting for these types of defects worth the cost of retesting. To the contrary, other types of defects (e.g., sort 21, 22, 40, etc.) did not have as high a retest passing rate (or had a zero retest passing rate) and it may not be worth retesting devices with such types of defects.

Figure 6:
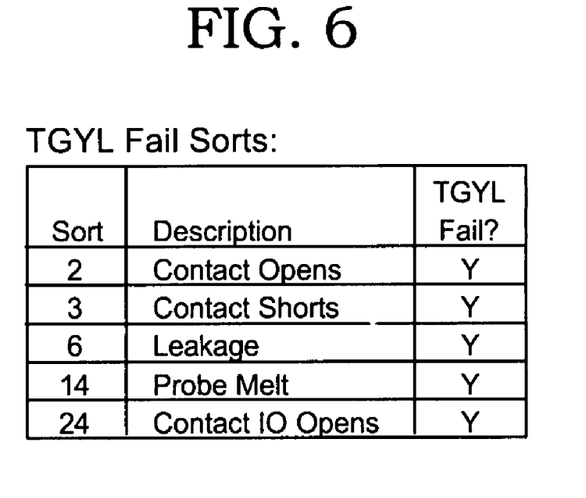
FIG. 6 is a table showing aspects of the invention.
Figure 7:
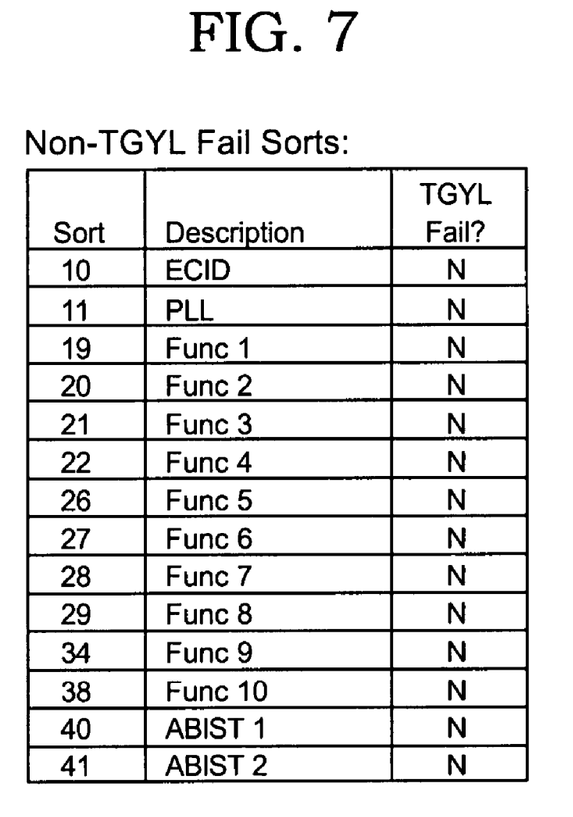
FIG. 7 is a table showing aspects of the invention.

Next, in item 106, the invention obtains TGLY fail sorts from historical data, which are shown in FIG. 6. The types of defects which are not normally associated with TGLY type failures are shown in FIG. 7. The classifications show in the drawings are merely an example of one specific type of device and its associated failures and the invention is not limited to this example, but instead is applicable to any type of testing and commonly known defects that result from improper testing.

Figure 8:
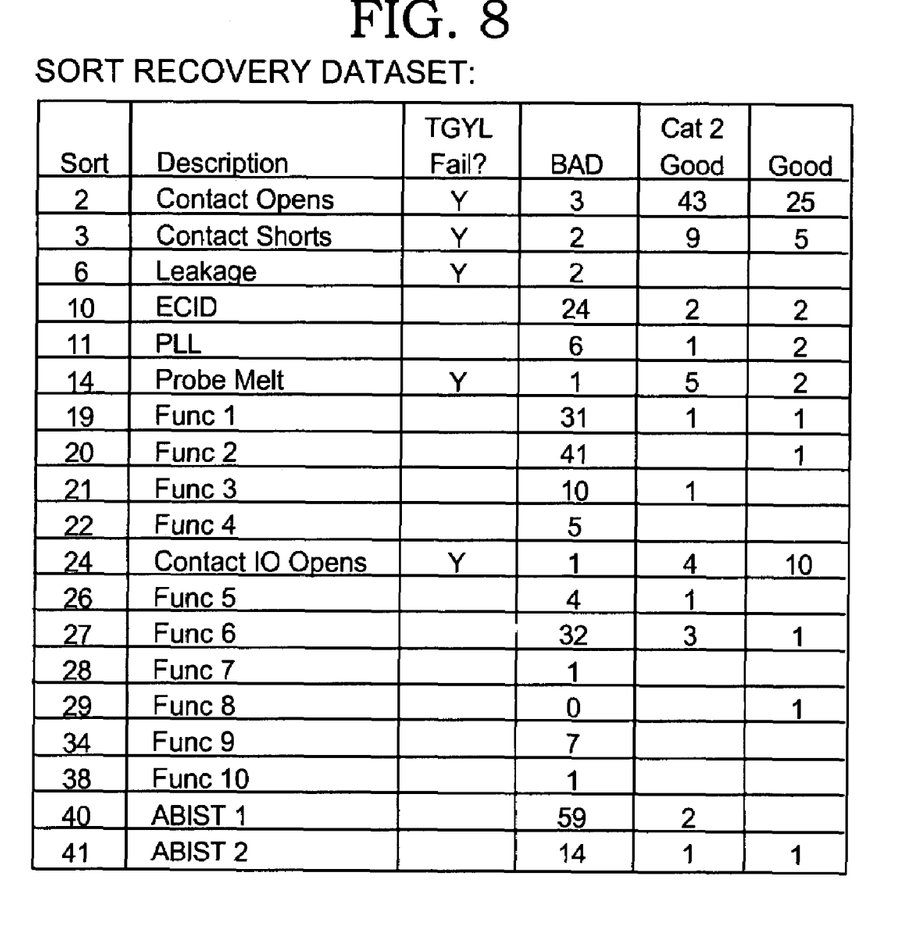
FIG. 8 is a table showing aspects of the invention.
Figure 9:
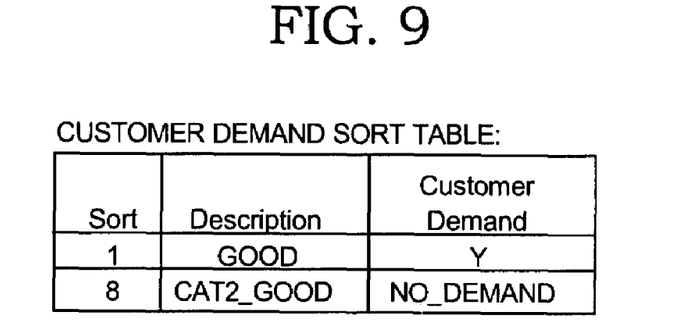
FIG. 9 is a table showing aspects of the invention.

In item 108, the invention creates the sort recovery dataset, an example of which is shown in FIG. 8. FIG. 8 is similar to FIG. 5, except FIG. 8 includes the TGLY data. In item 110, the invention obtains product supply/demand information that is shown in FIG. 9. A type of device having a "Good" rating is in high demand, while a device having a category 2 rating (Cat 2 Good) is determined to have a reduced demand. The criteria for determining whether a type of device will have a high or reduced demand will vary from device to device and from industry to industry, and, as discussed above, is based upon how many defects the device has.

Figure 10:
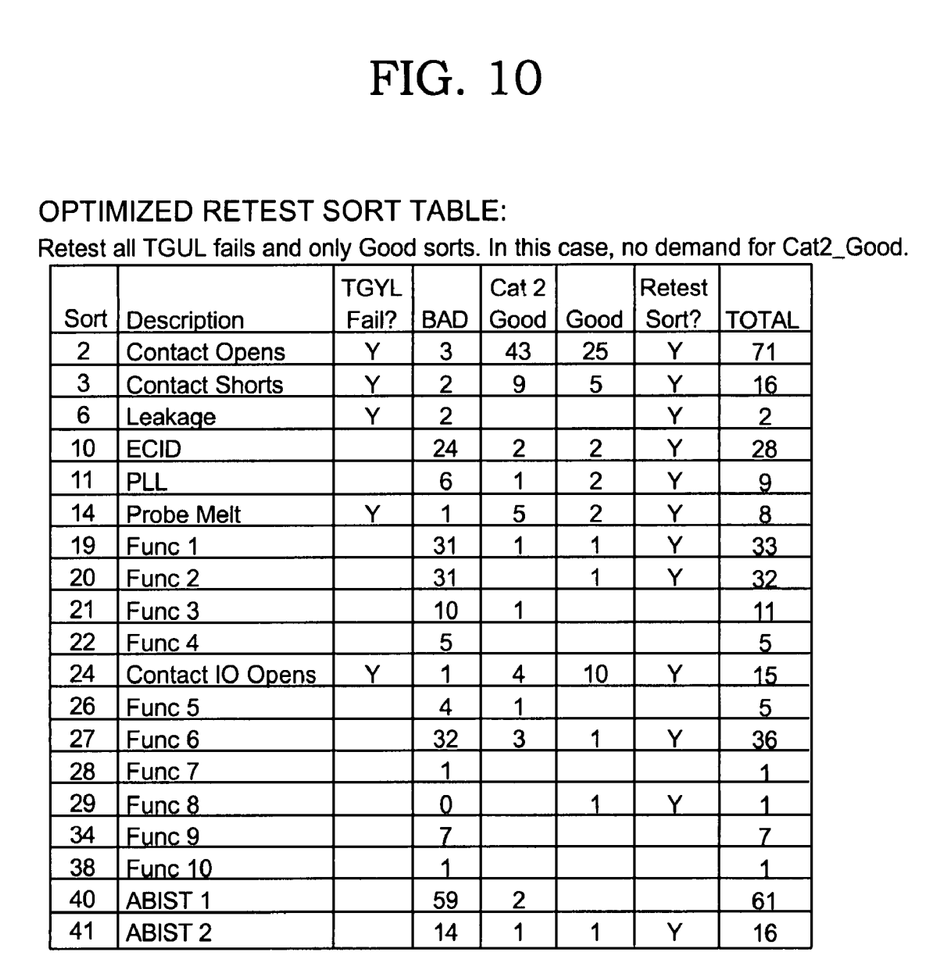
FIG. 10 is a table showing aspects of the invention.

In item 112, the invention creates the optimized retest table that is shown in FIG. 10 by adding the TGYL information to that shown in FIG. 8. In addition, the optimized retest table includes a "retest sort" column which identifies whether each type of defect is approved for retesting upon initial test failure. The invention evaluates these statistics to determine which types of failures have retest passing rates above a predetermined threshold and labels those types of defects as being approved with a "Y" in the retest sort column. In addition TGYL type defects can also be approved for retest and given a "Y" in the retest sort column Regardless of their retest passing rates. If desired, only the higher demand type devices ("Good column") that have passing rates above a predetermined threshold are retested and the reduced demand devices ("Cat 2 Good column) are not retested.

Figure 11:
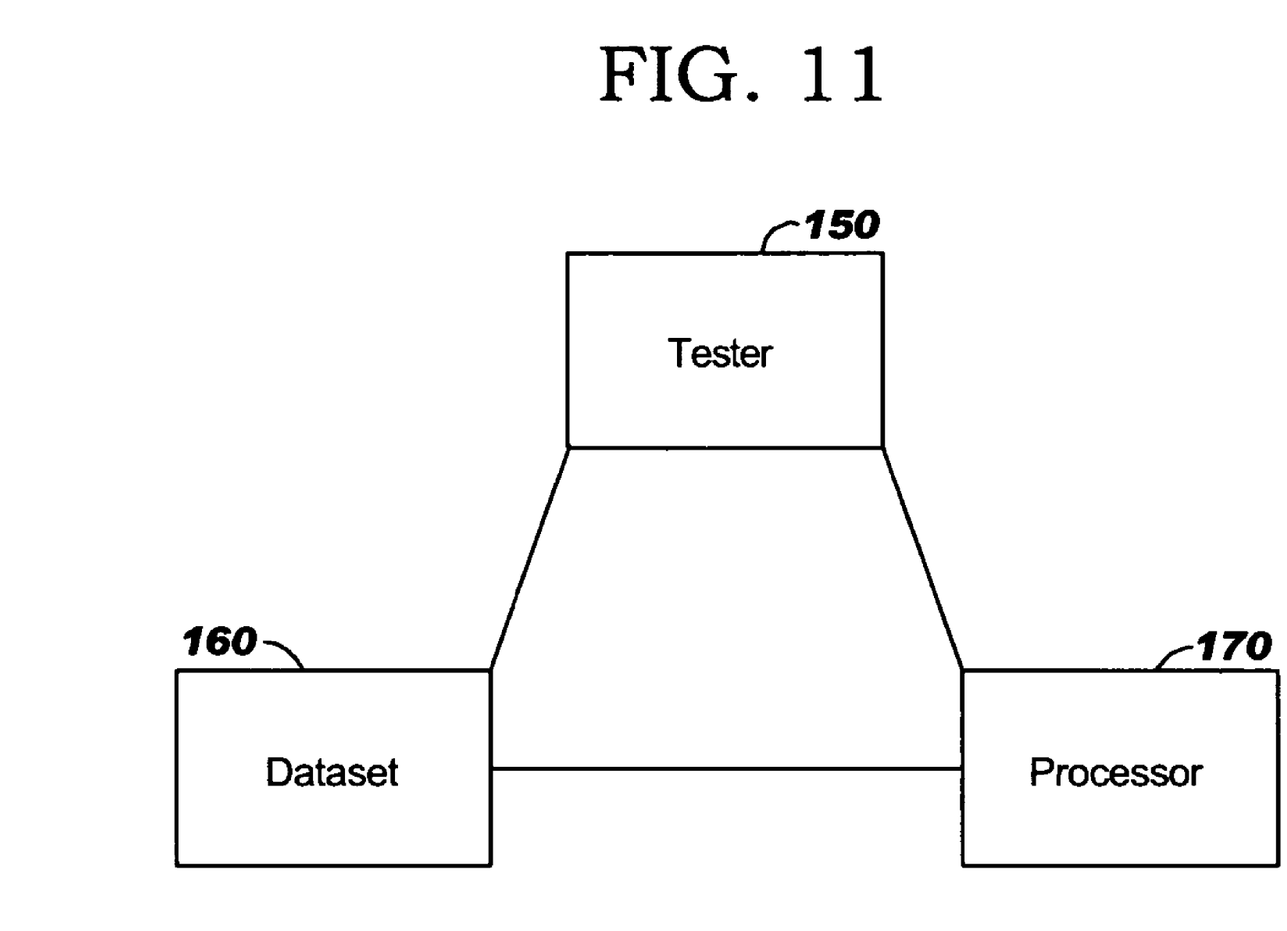
FIG. 11 is a system embodiment of the invention.

As shown in FIG. 11, the inventive system includes a tester 150 (e.g., probe-type tester), a database 160, and a processor 170. The database 160 includes an optimized retest table of the types of defects approved for retesting. Again, the types of defects approved for retesting is based upon previously acquired statistics of which types of failures have retest passing rates (after initially failing testing) above a predetermined threshold. In addition, defect types that result from improper testing can be included in the types of defects approved for retesting. Once again, device types having reduced demand are sometimes not retested. The processor 170 directs the tester 150 to test groups of devices and retest only devices in the additional failing groups that have one of the types of defects approved for retesting, without testing device types that have reduced demand.

Stated differently, the system includes means for testing (the tester 150) an initial group of devices to produce an initial failing group of devices that failed the testing, wherein the devices in the initial failing group are identified by type of failure; means for retesting (the tester 150) the devices in the initial failing group to identify a retested passing group of devices that passed the retesting; means for analyzing (the processor 170) the devices in the retested passing group to produce statistics regarding the likelihood that a failing device will pass the retesting according to the type of failure; means for evaluating (the processor 170) the statistics to determine which types of failures have retest passing rates above a predetermined threshold to produce types of defects approved for retesting, and storing the same in the means for storing (the database 160); means for testing (the tester 150) additional groups of devices to produce additional failing groups of devices that failed the testing of the additional groups; and means for retesting (the tester 150) only devices in the additional failing groups that have one of the types of defects approved for retesting.

Figure 12:
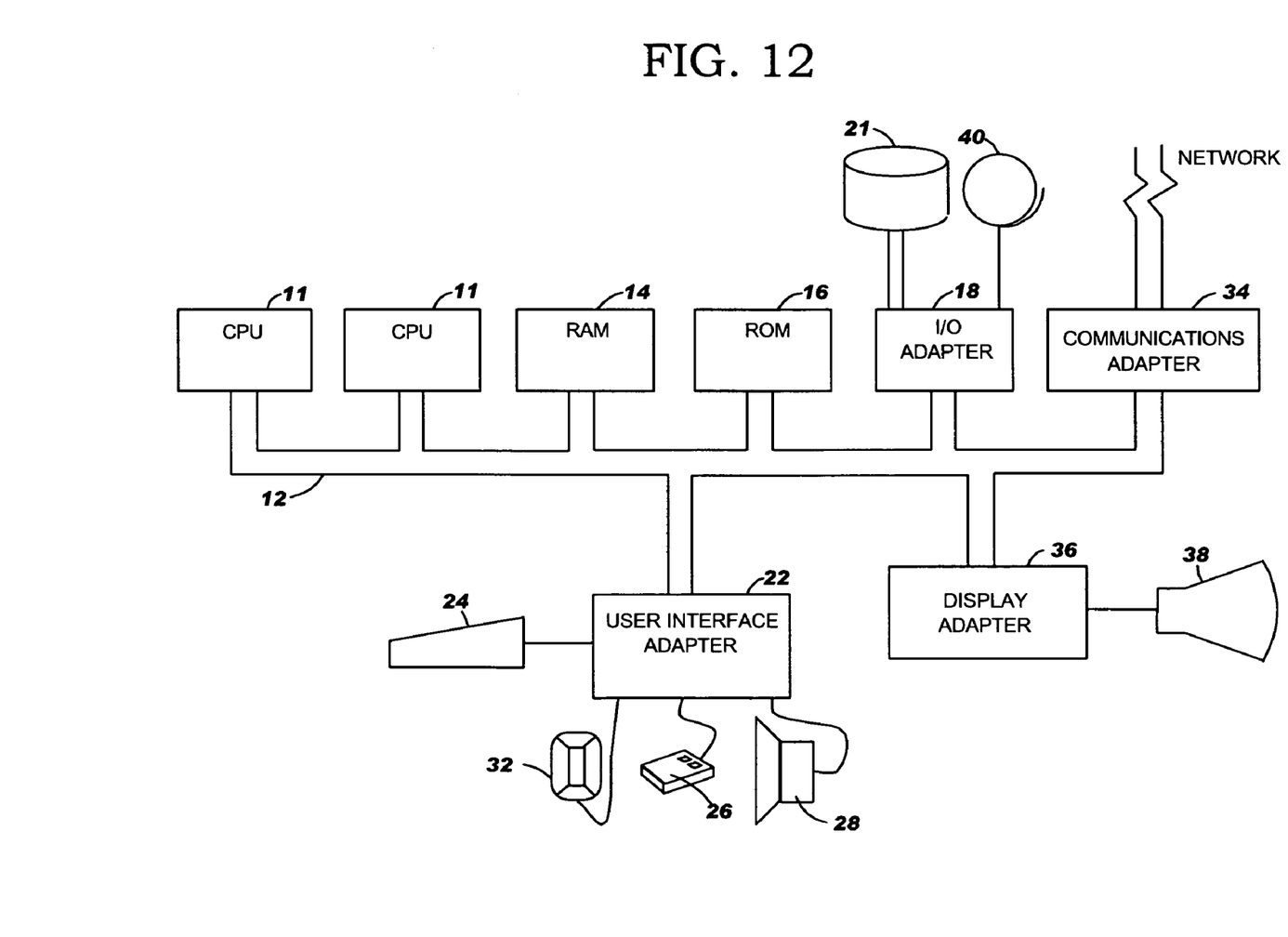
FIG. 12 is a schematic hardware diagram upon which the invention could operate.

A representative hardware environment for practicing the present invention is depicted in FIG. 12, which illustrates a typical hardware configuration of an information handling/computer system in accordance with the subject invention, having at least one processor or central processing unit (CPU) 11. CPUs 11 are interconnected via system bus 12 to random access memory (RAM) 14, read-only memory (ROM) 16, an input/output (I/O) adapter 18 for connecting peripheral devices, such as disk units 21 and tape drives 40 to bus 12, user interface adapter 22 for connecting keyboard 24, mouse 26, speaker 28, microphone 32, and/or other user interface devices such as touch screen device (not shown) to bus 12, communication adapter 34 for connecting the information handling system to a data processing network, and display adapter 36 for connecting bus 12 to display device 38. A program storage device readable by the disk or tape units, is used to load the instructions which operate the invention which is loaded also loaded onto the computer system.

Thus, with the invention, the data collected at wafer test is analyzed to optimize limits and rules on retest without sacrificing yield. It is important to retest failed devices to avoid discarding properly functioning devices. By not retesting all failed devices, substantial testing costs are saved. Reduction in the number of devices retested also reduces the number of touchdowns of the front end hardware.

The methodology of the invention begins by testing an initial group of devices (e.g., integrated circuit chips) to produce an initial failing group of devices that failed the testing. The devices in the initial failing group are identified by type of failure. Then, the invention retests the devices in the initial failing group to identify a retested passing group of devices that passed the retesting. Next, the invention analyzes the devices in the retested passing group which allows the invention to produce statistics regarding the likelihood that a failing device that failed the initial testing will pass the retesting according to the type of failure. Then, the invention evaluates these statistics to determine which types of failures have retest passing rates above a predetermined threshold. From this the invention produces a database 160 comprising an optimized retest table listing the types of defects that are approved for retesting.

The invention can also identify types of devices having a predetermined reduced demand. For example, devices having a certain number of defects may no longer be in strong demand and it may not be worth the cost to retest these types of devices. Therefore, in one option, the invention can add a listing of item types having reduced demand to the database 160 to prevent such reduced demand items from being retested.

Further, some types of defects may be known to be related to improper testing. One contributor to test failures is bad or marginal probe contact due to reasons that include poor test setup and marginal/defective probe hardware. In order to eliminate improper testing errors, the invention can add types of defects associated with testing errors to the types of defects approved for retesting.

Using the information in the optimized retest table database 160, the invention then tests additional groups of devices to produce additional failing groups of devices. The invention only retests devices that have one of the types of defects approved for retesting, and may not retest the types of devices for which there is the reduced demand. This process optimizes the retesting of the devices by only retesting for defects that have above a predetermined rate of retest passing.

In the example shown above, the invention reduced the chip retest rate by up to 80% when compared to retesting all failing devices. The invention can be performed without spending an excessive amount of money on new testers, and without impacting customer deliverables (i.e., no yield loss).

Some advantage of the invention vs. buying/leasing testers to alleviate test capacity issues can save in tester purchase/lease/maintenance costs. In one example, the invention takes less than one month to implement vs. 3-6 month lead time in obtaining new testers. The invention saves money in test time which alleviates test capacity issues. The invention improves delivery time to the customer by reducing test cycle time (fewer chips are retested). The retests are only performed on defect types that are proven to recover to customer deliverable devices. Thus, the invention increases the number of customer deliverable parts. The invention may recover parts that were sorted as an atypical TGYL fail sort during the first pass test.

While the invention has been described in terms of preferred embodiments, those skilled in the art will recognize that the invention can be practiced with modification within the spirit and scope of the appended claims.

What is claimed is:

1. A method for testing integrated circuit devices after manufacture, said method comprising:
    testing a group of devices to produce a failing group of devices that failed said testing, wherein said devices in said failing group are identified by type of defect;
    sorting said failing group into devices that have types of defects approved for retesting, said types of defects approved for retesting comprising types of defects having previously determined retest passing rates above a predetermined threshold, and into devices that do not have said types of defects approved for retesting; and
    retesting only said devices in said failing group that have at least one of said types of defects approved for retesting so that said retesting process is optimized.

2. The method in claim 1, further comprising retesting devices having types of defects associated with testing.

3. The method in claim 1, wherein said testing process comprises probe type testing.

4. The method in claim 1, wherein said sorting comprises accessing a listing of said types of defects approved for retesting, wherein said listing comprises an optimized retest table.

5. The method in claim 1, wherein said types of defects approved for retesting are based upon previously acquired statistics of previous testing of the same type of device.

6. A program storage device readable by a computer and tangibly embodying a program of instructions executable by said computer in order to perform a method of testing integrated circuit devices after manufacture, said method comprising:
    directing a tester to test a group of devices to produce a failing group of devices that failed said testing, wherein said devices in said failing group are identified by type of defect;
    sorting said failing group into devices that have types of defects approved for retesting, said types of defects approved for retesting comprising types of defects having previously determined retest passing rates above a predetermined threshold, and into devices that do not have said types of defects approved for retesting; and
    directing said tester to retest only said devices in said failing group that have at least one of said types of defects approved for retesting so as to optimize retesting.

7. The program storage device in claim 6, wherein said method further comprises retesting devices having types of defects associated with testing.

8. The program storage device in claim 6, wherein said testing process comprises probe type testing.

9. The program storage device in claim 6, wherein said sorting comprises accessing a listing of said types of defects approved for retesting, wherein said listing comprises an optimized retest table.

10. The program storage device in claim 6, wherein said types of defects approved for retesting is based upon previously acquired statistics of previous testing of the same type of device.

* * * * *